(12) United States Patent
Dufourt et al.

(10) Patent No.: US 6,879,511 B2
(45) Date of Patent: Apr. 12, 2005

(54) MEMORY ON A SOI SUBSTRATE

(75) Inventors: Denis Dufourt, Meylan (FR); Cédric Mayor, Grenoble (FR)

(73) Assignee: SOISIC, Grenoble (FR)

( * ) Notice: Subject to any disclaimer, the term of this patent is extended or adjusted under 35 U.S.C. 154(b) by 63 days.

(21) Appl. No.: 10/637,233

(22) Filed: Aug. 8, 2003

(65) Prior Publication Data

US 2004/0141352 A1 Jul. 22, 2004

(30) Foreign Application Priority Data

Aug. 8, 2002 (FR) ............................................. 02 10097

(51) Int. Cl.[7] .................................................. G11C 7/00
(52) U.S. Cl. ...................................... 365/154; 365/156
(58) Field of Search ................................ 365/154, 156, 365/63; 257/301, 390

(56) References Cited

U.S. PATENT DOCUMENTS

| | | | |
|---|---|---|---|
| 5,206,533 A | * | 4/1993 | Houston ..................... 257/393 |
| 5,886,388 A | | 3/1999 | Wada et al. |
| 6,657,885 B2 | * | 12/2003 | Kuriyama et al. ........... 365/154 |
| 2002/0003241 A1 | | 1/2002 | Kuriyama et al. |
| 2002/0067636 A1 | | 6/2002 | Kuriyama et al. |

FOREIGN PATENT DOCUMENTS

| | | |
|---|---|---|
| FR | 2777686 A | 10/1999 |
| GB | 2332779 A | 6/1999 |

OTHER PUBLICATIONS

Sasaki Masayoshi, Static Random Access Memory, Patent Abstracts of Japan, Publication Date: Jul. 13, 1993, vol. 017, No. 596.

French Search Report, dated Apr. 23, 2003 from French Patent Application No. 02/10097.

\* cited by examiner

*Primary Examiner*—Vu A. Le
(74) *Attorney, Agent, or Firm*—Lowrie, Lando & Anastasi, LLP

(57) ABSTRACT

A SRAM on an SOI substrate comprising a network of rows and columns of 6T memory cells with two inverters and two switch transistors, each cell being connected to two bit lines and to one of the word lines. Each memory cell comprises two first regions of the first conductivity type, each first region comprising the drains or the sources of first and third transistors, and being in contact with a second region of the second conductivity type comprising the drain or the source of a second transistor, the first and second regions being short-circuited by a conductive material, the conductive tracks of the first level taking part in the interconnections between the inverters, and in the interconnections between the switch transistors and the word line being parallel to the bit lines.

10 Claims, 5 Drawing Sheets

MEMORY ON A SOI SUBSTRATE

BACKGROUND OF THE INVENTION

1. Field of the Invention

The present invention relates to memories comprising an array of memory cell rows and columns formed on a substrate of silicon-on-insulator (SOI) type.

2. Discussion of the Related Art

FIG. 1 schematically shows a cell of a static memory of random access type (SRAM) of conventional structure with six transistors, called a 6T cell. The memory cell comprises inverters 1, 2, connected in antiparallel. The respective inputs of inverters 1, 2 are connected to respective bit lines BL, $\overline{BL}$ via switches 3, controlled by a row selection signal carried by a word line WL. Each inverter 1, 2, is supplied by a high voltage VDD and a low voltage GND, currently the ground.

To write information into the memory cell, a voltage VDD is applied on one of bit lines BL, $\overline{BL}$ and a voltage GND is applied on the other. Then, switches 3 are turned on to set the states of the inputs and outputs of inverters 1 and 2. Switches 3 are then turned off and the state of the signals across inverters 1 and 2 is maintained.

To read an information from the memory cell, each of bit lines BL and $\overline{BL}$ is precharged to a voltage ranging between voltages VDD and GND, then switches 3 are turned on so that the voltages on the bit lines vary according to the state of the signals across inverters 1 and 2. A sense amplifier (not shown) connected to the bit lines provides a binary information in relation with the information kept in the memory cell.

Inverter 1 comprises a P-channel MOS transistor PI1 in series with an N-channel MOS transistor NI1. The source of transistor PI1 is connected to voltage VDD and the source of transistor NI1 is connected to voltage GND. The drains of transistors PI1 and NI1 are interconnected at a point O2. The gates of transistors PI1 and NI1 are interconnected at a point O1. Similarly, inverter 2 comprises transistors PI2 and NI2 connected like transistors PI1 and NI1, the gates of transistors PI2 and NI2 being connected to terminal O2 and the common drains of transistors PI2 and NI2 being interconnected at terminal O1. Switches 3 are formed of MOS transistors M1 and M2, generally with N channels.

FIG. 2 shows a row of a conventional SRAM. Six 6T memory cells MC0 to MC5 have been shown. Conventionally, to a memory cell row corresponds a single word line WL0 and to a memory cell column correspond two bit lines (BLj and $\overline{BLj}$, j ranging from 0 to 5). In such a memory, upon writing or reading of data in a memory cell, it is necessary to select, with word line WL0, all the memory cells in the row to which the searched memory cell belongs. This results in a high electric consumption.

To decrease the consumption, it is desired to reduce the number of memory cells activated upon access to the memory. A possibility consists of using several word lines per memory cell row, knowing that each word line activates a subset of memory cells of the row. This type of so-called "multiline" architecture thus requires having metal tracks corresponding to the different word lines run over the memory cells. By reducing the number of selected memory cells at each write and/or read operation, the memory consumption is decreased.

FIG. 3 shows a row of an example of embodiment of a "multiline" SRAM for which two word lines WL0, WL1 are associated with each row. Six 6T memory cells MC0' to MC5' have been shown. Each word line WL0, WL1 is connected to one memory cell out of two. On each read/write operation, only half of the memory cells in the row are thus selected.

It is also desired to obtain a memory for which the read and write operations may be performed at a high frequency. For this purpose, it is desired to reduce the bit line capacitance by decreasing the memory cell height.

Further, it is generally desired to decrease the general surface area of the memory cells.

However, in the case where a "multiline" memory is desired to be formed, it is often difficult to form a memory cell with a small surface area, and in particular with a small height.

To illustrate such a difficulty, a conventional example of a topology of 6T memory cell MC0 of FIG. 2 has been shown in FIG. 4, and a conventional example of topology of 6T memory cell MC0' of the memory of FIG. 3 has been shown in FIG. 5.

FIG. 4 schematically shows memory cell MC0 of FIG. 2 in which the electric circuit of FIG. 1 is formed by a technology with one polysilicon level and three metallization levels formed on an SOI substrate. Other polysilicon and metallization levels may be present and used.

The surfaces delimited by a thin line correspond to active areas of the semiconductor substrate or to polysilicon strips deposited on the substrate and corresponding to MOS transistor gates. Although the view is not shown to scale, the relative dimensions and positions of each region are kept to show the real bulk of the integrated circuit. The double lines correspond to level-one metal strips. The thick horizontal black lines correspond to level-two metal strips, and the thick vertical black lines correspond to level-three metal strips. The crosses represent contacts connecting, through the insulating layers located between the metallization levels and the polysilicon level, metal strips to active areas or to polysilicon strips or vias connecting, through the insulating layers located between the metallization levels, metal strips to other metal strips. For clarity, the metal strips are not shown with surface areas proportional to the surface areas of the active areas. However, the position of each line is in accordance with the real position of the corresponding metal strip in the integrated circuit.

An active area 11 corresponds to MOS transistor A1, to MOS transistor N1, and to the connection between these transistors. An active area 12 corresponds to MOS transistor A2, to MOS transistor N2, and to the connection between these transistors. Active areas 13, 14 respectively correspond to MOS transistors P1, P2. Gates GN1, GP1 of respective MOS transistors N1, P1 correspond to portions of a polysilicon strip 16. Gates GP2, GN2 of respective MOS transistors P2, N2 correspond to portions of a polysilicon strip 18. Gates GA1, GA2 of MOS transistors A1, A2 correspond to respective portions of polysilicon strips 19, 20.

The different metal tracks of level one, two, and three are used to connect active areas 11, 12, 13, 14 and polysilicon strips 16, 18, 19, 20 to obtain an electric diagram equivalent to the diagram shown in FIG. 1. In particular, word line WL0 connected to gates GA1, GA2 of transistors A1, A2 corresponds in the present example to a level-two horizontal metal strip and supply lines GND, VDD and bit lines BL0, $\overline{BL0}$ correspond to level-three vertical metal strips.

To reduce the memory cell surface area, the contacts, vias, and metal portions ensuring the connection between gates GA1, GA2 of transistors A1, A2 and word line WL0 are arranged at the level of the vertical edges of the same row on either side of the shown cell.

FIG. 5 shows an example of embodiment of memory cell MC0' of the "multiline" memory of FIG. 3 which keeps a topology similar to that of FIG. 4 as for the transistor arrangement. For two adjacent cells of a same row, gates GA1, GA2 of transistors A1, A2 are connected to different word lines WL0, WL1. The contacts, vias, and metal portions ensuring the connection of gates GA1, GA2 to word lines WL0, WL1 thus cannot be shared between two adjacent memory cells and must thus be placed within the cell.

To be able to connect the two gates GA1, GA2 of transistors A1 and A2 to one or the other of word lines WL0, WL1, it is necessary to provide two vertical metal tracks 23, 24, respectively connected to gates GA1, GA2 of transistors A1, A2 and to one of word lines WL0, WL1. Given the bulk of the first metallization level, metal tracks 23, 24 are formed in the second metallization level. Word lines WL0, WL1 thus correspond to level-three metal strips, and supply lines GND, VDD and bit lines BL0, $\overline{BL0}$ correspond to level-two metal strips.

The displacement of the contacts, vias, and metal portions ensuring the contact of gates GA1, GA2 of transistors A1, A2 to the inside of the memory cell requires increasing the memory cell height due to the bulk of the first metallization level. Further, the presence of tracks 23, 24 at the same metallization level as bit lines BL0, $\overline{BL0}$ and supply lines GND, VDD requires increasing the memory cell width.

In a manufacturing technology in which the smallest pattern has a 0.13-$\mu$m length, a 2.80-$\mu$m width $\Delta X$, a 1.10-$\mu$m height $\Delta Y$, and a 3.08-$\mu m^2$ surface area may be obtained for the memory cell of FIG. 4. As a comparison, the memory cell of FIG. 5 has a 2.56-$\mu$m width $\Delta X$, a 1.54-$\mu$m height $\Delta Y$, and a 3.9424-$\mu m^2$ surface area. A 40% increase in the height and a 22% increase in the surface area are thus obtained. The capacitances of bit lines BL0, $\overline{BL0}$ of the "multiline" memory of FIG. 5 are thus increased with respect to those of the memory of FIG. 4. Performances in terms of read/write frequency are thus reduced.

SUMMARY OF THE INVENTION

The present invention aims at providing a topology of a memory cell formed on an SOI substrate having a surface area smaller than that of a conventional memory cell.

The present invention also aims at providing a topology of a memory cell formed on an SOI substrate enabling obtaining a "multiline" memory for which the surface area and in particular the height of each cell increases little with respect to a memory cell of a memory with a single word line per row.

To achieve these objects, the present invention provides a SRAM comprising a network of rows and columns of 6T memory cells with two inverters and two switch transistors formed in a substrate of silicon-on-insulator type, the inputs of the two inverters of each memory cell being connected to two bit lines via the two switch transistors controlled by a signal provided by a word line, each memory cell comprising six transistors having their gates corresponding to a same level of a first conductive material and having their interconnections formed by conductive tracks of at least one second conductive material distributed over three levels, each inverter comprising a first transistor of a first conductivity type and a second transistor of a second conductivity type, each switch comprising a third transistor of the first conductivity type, in which each memory cell comprises two first regions of the first conductivity type, each first region comprising the drains or the sources of a first and of a third transistors, and being in contact with a second region of the second conductivity type comprising the drain or the source of a second transistor, the first and second associated regions being short-circuited by a third conductive material covering said first and second regions, the word line and the bit lines corresponding to conductive strips of levels higher than the first level, the conductive tracks of the first level taking part in the interconnections between the inverters, and in the interconnections between the switch transistors and the word line being parallel to the bit lines.

According to an embodiment of the present invention, single word line corresponding to a metal strip of level two or three is associated with a row, each memory cell in the row being connected to said word line, the bit lines corresponding to metal strips perpendicular to the word line and of a level different from the word line level.

According to an embodiment of the present invention, at least two word lines, corresponding to metal strips of level two or three, are associated with a row, each memory cell in the row being connected to one of the word lines, the bit lines corresponding to metal strips perpendicular to the word lines and of a level different from the word line level.

According to an embodiment of the present invention, each memory cell comprises at least one level-one conductive track perpendicular to the word lines and connected to one of the word lines and to one of the third transistors.

According to an embodiment of the present invention, each memory cell, arranged between two other adjacent memory cells of the same row, is connected to two supply lines at a first voltage, each supply line being shared between the memory cell and one of the adjacent memory cells and corresponding to a conductive strip of the same level as the bit lines, parallel to the bit lines and arranged on the common edge between two adjacent cells.

According to an embodiment of the present invention, the sources and the drains of first and third transistors are aligned parallel to the bit lines.

According to an embodiment of the present invention, each memory cell comprises two active areas, each active area comprising one of the first regions and the associated second region, the active areas being substantially symmetrical with respect to the memory cell center.

According to an embodiment of the present invention, for each memory cell, arranged between two other adjacent memory cells of the same row, the sources and the drains of first and third transistors are aligned along a common edge between the memory cell and one of the adjacent memory cells.

According to an embodiment of the present invention, each memory cell is connected to a supply line at a second voltage corresponding to a conductive strip of the same level as the bit lines, parallel to the bit lines and arranged between the bit lines.

According to an embodiment of the present invention, for each memory cell, arranged between two other adjacent memory cells of the same column, the source or the drain of first and second transistors and the source or the drain of a third transistor are aligned along a common edge between the memory cell and one of the adjacent memory cells.

The foregoing objects, features, and advantages of the present invention will be discussed in detail in the following non-limiting description of specific embodiments in connection with the accompanying drawings.

DETAILED DESCRIPTION

Figure 7:
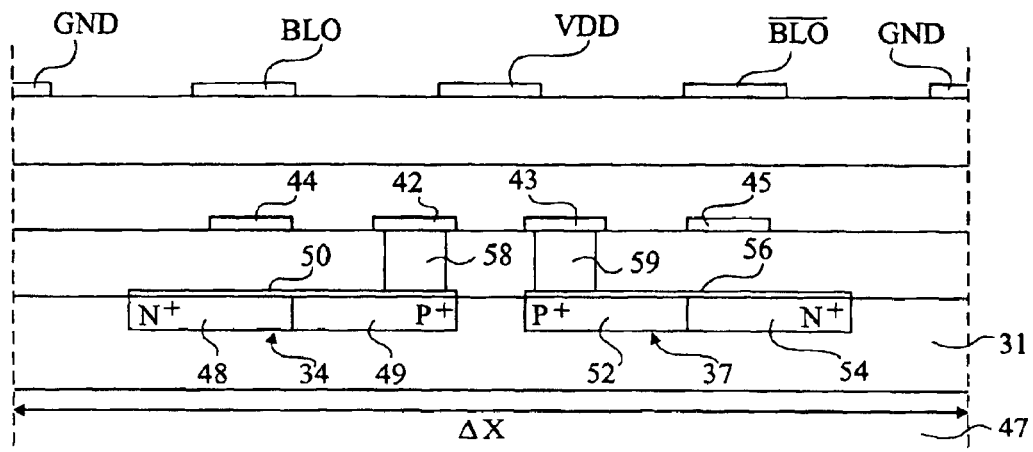
FIGS. 7, 8, 9 respectively show simplified cross-sections of FIG. 6 along lines VII—VII, VIII—VIII, and IX, IX.
Figure 8:
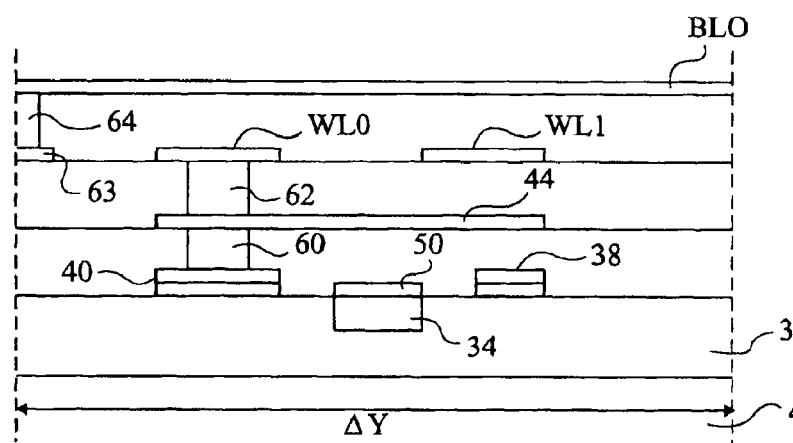
Figure 9:
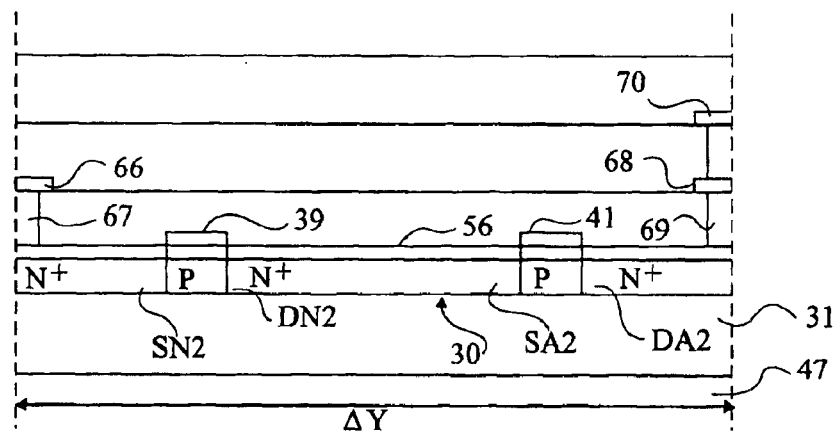

It should be noted that in FIGS. 7 to 9, as usual in the field of integrated circuit representation, the thicknesses and lateral dimensions of the various layers, strips, tracks, etc. are not drawn to scale, either within a same drawing, or from one drawing to another, to improve the readability of this drawing. Further, same reference numerals will designate, in the different drawings, same elements.

Figure 6:
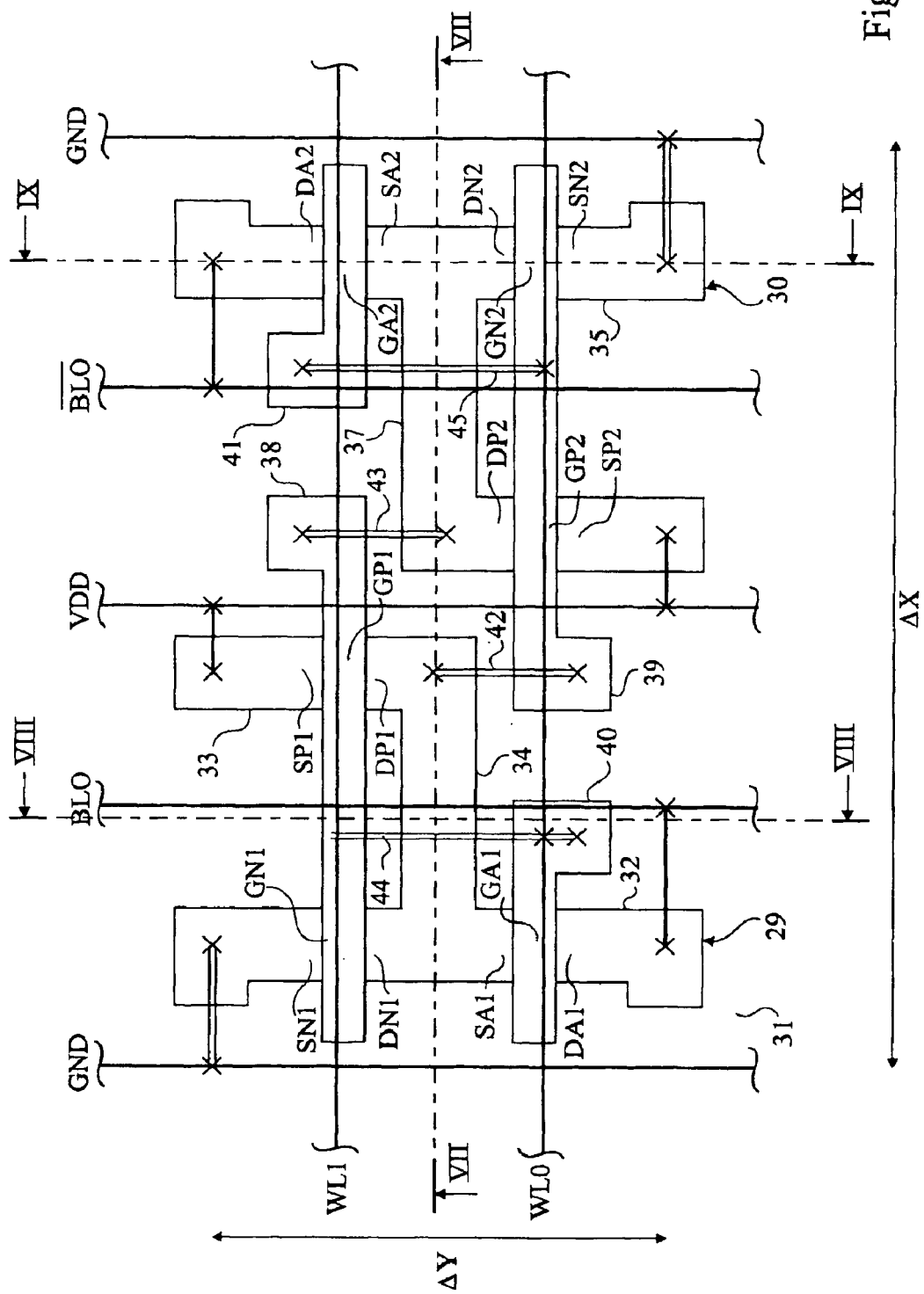
FIG. 6 shows an embodiment of a cell of a SRAM with two word lines per row according to the present invention.

FIG. 6 shows an example of the forming of a 6T cell of a SRAM with two word lines per row. The memory cell is formed on a substrate of substrate-on-insulator type (SOI) and comprises two active doped single-crystal silicon areas 29, 30 insulated from each other by an insulating material 31. Active areas 29, 30 are substantially symmetrical with respect to the memory cell center.

Active area 29 comprises a first vertical portion 32 corresponding to transistor N1, to transistor A1, and to the connection between these transistors, a second vertical portion 33 corresponding to transistor P1, and a horizontal portion 34 containing a PN junction and connecting vertical portions 32, 33. Similarly, active area 30 comprises a first vertical portion 35 corresponding to transistor N2, to transistor A2, and to the connection between these transistors, a second vertical portion 36 corresponding to transistor P2 and a horizontal portion 37 containing a PN junction connecting the two vertical portions 35, 36. A conductive material (not shown), for example, silicide, covers each active area 29, 30 at the level of drains DP1, DN1, DP2, DN2 of transistors P1, N1, P2, N2 of sources SA1, SA2 of transistors A1, A2 and of horizontal portions 34, 37.

Gates GN1, GP1 of transistors N1, P1 correspond to portions of a horizontal silicon strip 38. Gates GN2, GP2 of transistors N2, P2 correspond to portions of a horizontal silicon strip 39. Gates GA1, GA2 of transistors A1, A2 correspond to respective portions of two horizontal polysilicon strips 40, 41.

Drain DP1 of transistor P1 is connected to polysilicon strip 39 via a level-one vertical metal track 42. Drain DP2 of transistor P2 is connected to polysilicon strip 38 via a level-one vertical metal track 43.

Supply lines GND, VDD and bit lines BL0, $\overline{BL0}$ correspond to level-three vertical metal strips connected to active areas 29, 30 by contacts, vias, and metal tracks or portions of levels one and two.

Two word lines WL0, WL1 are formed by two level-two horizontal metal strips. Two level-one vertical metal tracks 44, 45 substantially extend, each, under word lines WL0 and WL1 and enable connecting gates GA1, GA2 of transistors A1, A2 to the other one of word lines WL0, WL1. In the present example, gates GA1, GA2 of transistors A1, A2 are connected to word lines WL0.

FIG. 7 shows a cross-section of FIG. 6 along line VII—VII. As can be more clearly seen from this drawing, insulating material 31 is formed on a substrate 47, for example, silicon. Horizontal portion 34 of active area 29 divides into an N doped portion 48 and a P doped portion 49 which are covered with a silicide layer 50. Similarly, horizontal portion 37 of active area 30 divides into a P doped portion 52 and an N doped portion 54 which are covered with a silicide layer 56. Level-one track 42 is connected to the horizontal portion 34 by a contact 58. Level-one track 43 is connected to horizontal portion 37 by a contact 59.

Bit lines BL0, $\overline{BL0}$ and supply lines GND, VDD correspond to level-three equidistributed vertical metal strips. In particular, supply lines GND are arranged at the level of the right-hand and left-hand vertical edges of the memory cell and are put in common with the adjacent memory cells of the same row.

FIG. 8 shows a cross-section of FIG. 6 along line VIII—VIII. Polysilicon strip 40 is connected to level-one metal track 44 by a contact 60. Metal track 44 is itself connected to word line WL0 by a via 62. Bit line BL0 is connected to a level-two metal track 63 by a via 64. Via 64 and track 63 are arranged at the level of the lower horizontal edge of the memory cell and are put in common with the adjacent memory cell of the same column under the shown cell.

FIG. 9 shows a cross-section of FIG. 6 along line IX—IX. Active area 30 corresponding to transistors A2, N2 is connected, on the side of source SN2 of transistor N2, to a level-one horizontal metal track 66 by a contact 67, track 66 being intended to be connected to supply line GND located along the right-hand vertical edge of the memory cell. Track 66 and via 67 are arranged at the level of the lower horizontal edge of the memory cell and are put in common with the adjacent cell of the same column under the shown cell. Active area 30 is also connected, on the side of drain DA2 of transistor A2, to a level-one metal portion 68 by a contact 69, metal portion 68 being itself connected to a level-two horizontal metal track 70 which is connected to bit line $\overline{BL0}$. Metal portion 68 and track 70, contact 69 and via 70 are arranged at the level of the upper horizontal edge of the memory cell and are put in common with the adjacent cell of the same column above the shown cell.

The present invention enables reducing the cell surface by the putting in common of elements with the adjacent cells.

Drains DA1, DA2 of transistors A1, A2 are arranged on the side of the horizontal edges of the memory cell to form contacts, vias and metal portions ensuring the connection between transistors A1, A2, and bit lines BL0, $\overline{BL0}$ common for adjacent memory cells of a same column. Similarly, sources SP1, SP2 of transistors P1, P2 are arranged on the side of the vertical edges of the memory cell to form contacts, vias, and metal portions ensuring the connection between transistors P1, P2 and supply lines VDD common between two adjacent cells of a same column. Further, sources SN1, SN2 of transistors N1, N2 are arranged close to the memory cell corners, which enables placing supply lines GND at the level of the vertical edges of the cell. A supply line GND can thus be put in common between two adjacent memory cells of the same row, and contacts, vias, and metal portions ensuring the connection between one of transistors N1, N2 and a supply line GND common to four cells having one common corner can thus be formed.

The memory cell being formed on an SOI substrate, it is possible to use horizontal portions 34, 37 short-circuited by silicide layers 50, 56 to form the connection between, respectively, drains DP1, DP2 of transistors P1, P2 and drains DN1, DN2 of transistors N1, N2. This enables eliminating the level-one metal tracks and the associated contacts which are generally used to form such connections. Vertical metal tracks 44, 45 taking part in the connection between gates GA1, GA2 of transistors A1, A2 and word lines WL0, WL1 may be formed by level-one tracks and word lines WL0, WL1 may be formed by level-two metal strips.

Except for the level-one metal strips taking part in the connection between supply line GND and transistors N1, N2, and between supply line VDD and transistors P1, P2, all level-one metal tracks are arranged vertically, which enables reducing the height of the memory cell according to the present invention.

Figure 1:
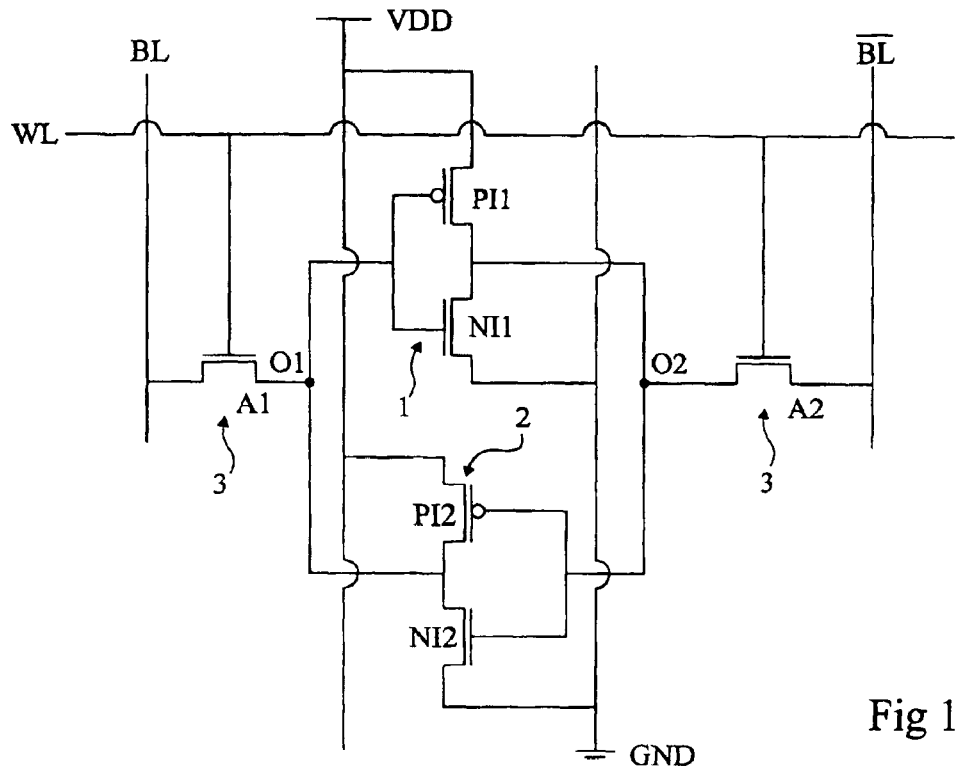
FIG. 1, previously described, schematically shows a cell of a conventional SRAM.
Figure 2:
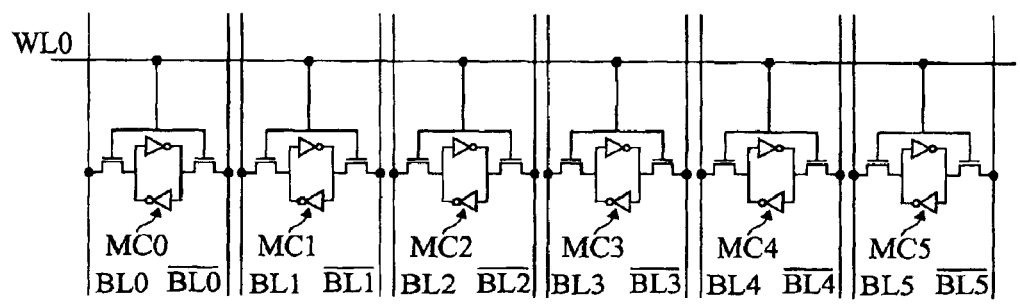
FIG. 2, previously described, schematically shows a row of a conventional SRAM with one word line per row.
Figure 3:
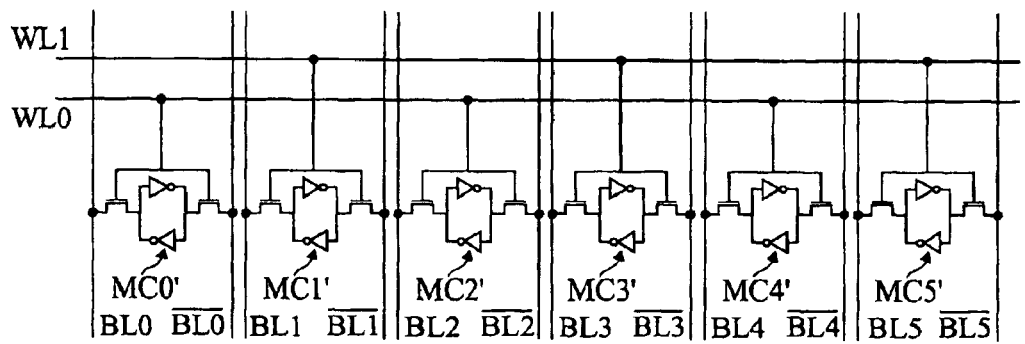
FIG. 3, previously described, schematically shows a row of a conventional SRAM with two word lines per row.
Figure 4:
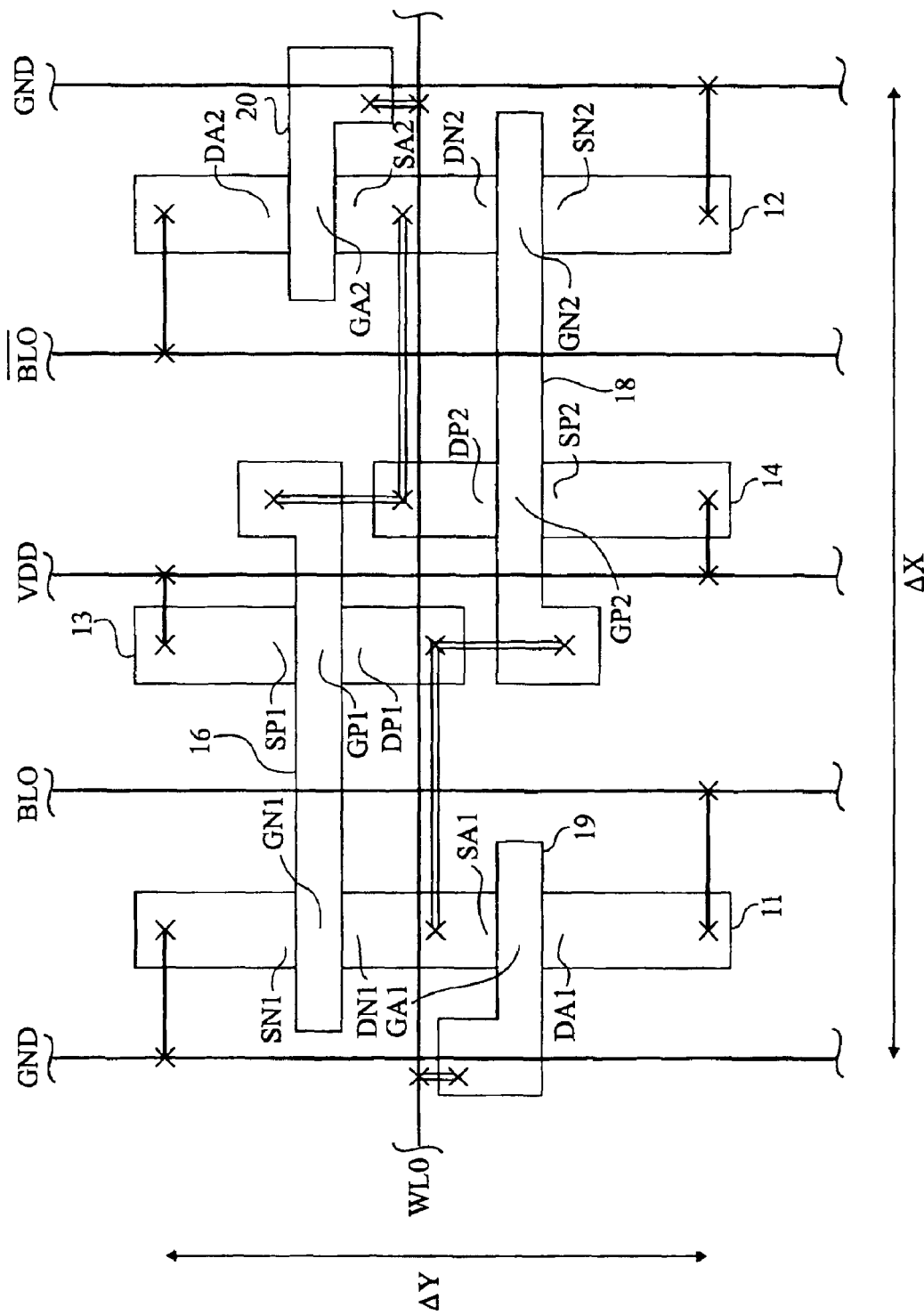
FIG. 4, previously described, schematically shows an example of a conventional topology of a cell of a SRAM with one word line per row.
Figure 5:
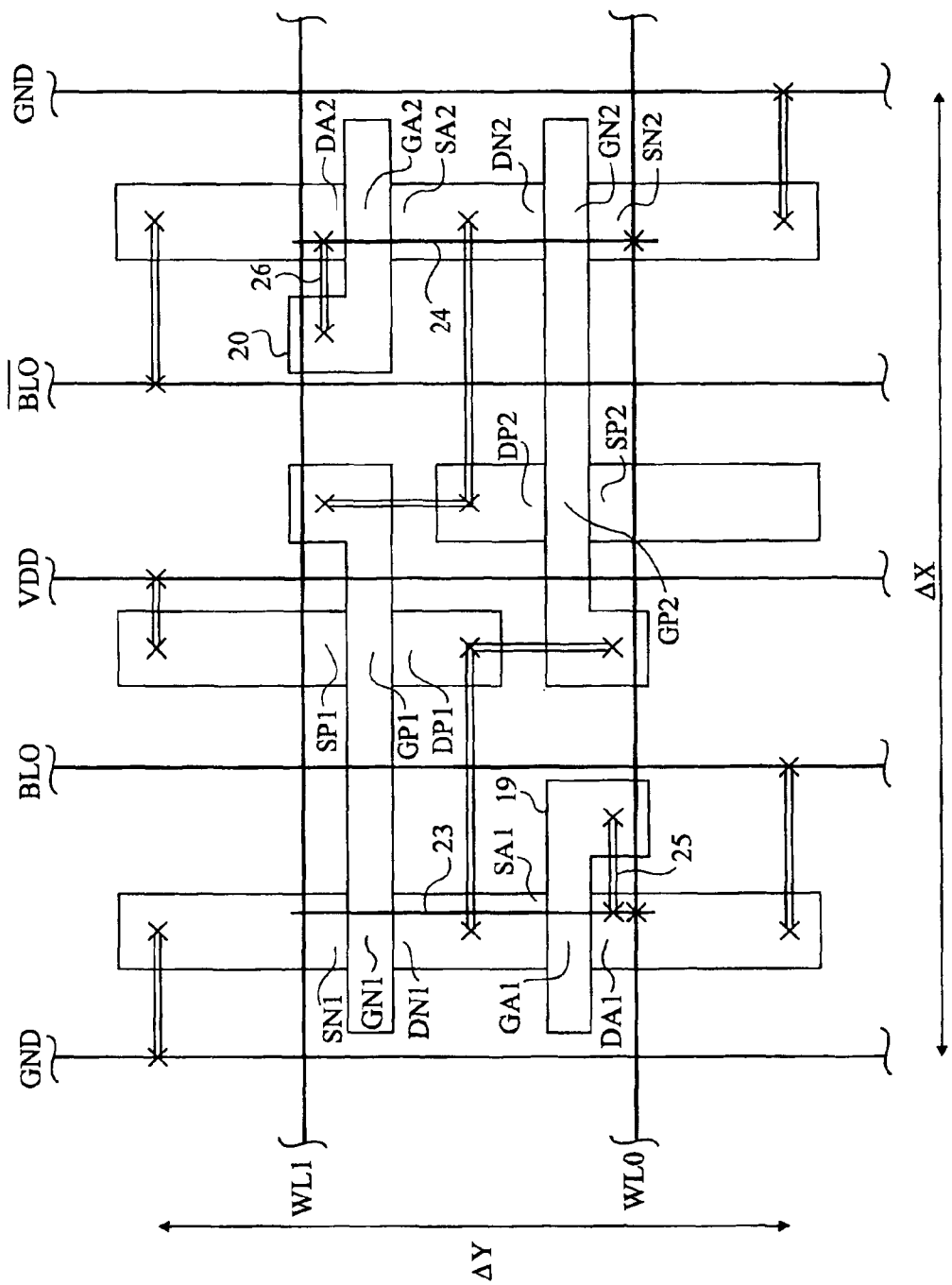
FIG. 5 previously described, schematically shows an example of a conventional topology of a cell of a SRAM with two word lines per row.

For a memory cell with a single word line per row keeping a topology similar to that of FIG. 6, a 2.56-$\mu$m width $\Delta X$, a 1.10-$\mu$m height $\Delta Y$, and a 2.816-$\mu m^2$ surface area are obtained. The obtained surface area thus is smaller by 8.6% than the surface area of the cell of FIG. 4. For the memory cell with two word lines per row according to FIG. 6, a 2.56-$\mu$m width $\Delta X$, a 1.12-$\mu$m height $\Delta Y$, and a 2.8672-$\mu m^2$ surface area are obtained. The height and surface area of the "multiline" memory thus vary little with respect to the cell of the memory with one word line per row. Further, the obtained height $\Delta Y$ is smaller by 27% than the height of the cell of FIG. 5, thus enabling reduction of the bit line capacitances and obtaining of a "multiline" memory cell with a small read and write time.

According to an alternative of the present invention, the word lines may correspond to level-three metal strips. The bit lines and the supply lines may then correspond to level-two metal strips. In this case, the surface areas of a memory cell with a single word line per row and of a memory cell with two word lines per row are substantially identical to the previously-indicated values.

Of course, the present invention is likely to have various alterations, modifications, and improvements which will readily occur to those skilled in the art. In particular, the forming of the memory cell has been described as involving one polysilicon level and three metallization levels. It is quite possible to replace the metal strips of one or several metallization levels with another conductive material. For example, the first metallization level may be replaced with a level two of doped polysilicon. Further, the transistor gates may be formed in a conductive material other than polysilicon. Said material may be, for example, a metal. Moreover, the memory point switches may be formed by P-channel MOS transistors, with the necessary adaptations.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A SRAM comprising a network of rows and columns of 6T memory cells with two inverters and two switch transistors formed in a substrate of silicon-on-insulator type, the inputs of the two inverters (1, 2) of each memory cell being connected to two bit lines (BL0, $\overline{BL0}$) via the two switch transistors (3) controlled by a signal provided by a word line (WL0, WL1), each memory cell comprising six transistors (N1, P1, A1, N2, P2, A2) having their gates (GN1, GP1, GA1, GN2, GP2, GA2) corresponding to a same level of a first conductive material and having their interconnections formed by conductive tracks of at least one second conductive material distributed over three levels, each inverter comprising a first transistor (N1, N2) of a first conductivity type and a second transistor (P1, P2) of a second conductivity type, each switch comprising a third transistor (A1, A2) of the first conductivity type, wherein each memory cell comprises two first regions (48, 54) of the first conductivity type, each first region comprising the drains or the sources of a first (N1, N2) and a third (A1, A2) transistors, and being in contact with a second region (49, 52) of the second conductivity type comprising the drain or the source of a second transistor (P1, P2), the first and second associated regions being short-circuited by a third conductive material covering said first and second regions, the word line and the bit lines corresponding to conductive strips of levels higher than the first level, the conductive tracks (42, 43, 44, 45) of the first level taking part in the interconnections between the inverters, and in the interconnections between the switch transistors and the word line being parallel to the bit lines.

2. The memory of claim 1, wherein a single word line corresponding to a metal strip of level two or three is associated with a row, each memory cell in the row being connected to said word line, the bit lines (BL0, $\overline{BL0}$) corresponding to metal strips perpendicular to the word line and of a level different from the word line level.

3. The memory of claim 1, wherein at least two word lines (WL0, WL1), corresponding to metal strips of level two or three, are associated with a row, each memory cell in the row being connected to one of the word lines, the bit lines (BL0, $\overline{BL0}$) corresponding to metal strips perpendicular to the word lines and of a level different from the word line level.

4. The memory of claim 3, wherein each memory cell comprises at least one level-one conductive track (44, 45) perpendicular to the word lines (WL0, WL1) and connected to one of the word lines and to one of the third transistors (A1, A2).

5. The memory of claim 1, wherein each memory cell, arranged between two other adjacent memory cells of the same row, is connected to two supply lines (GND) at a first voltage, each supply line being shared between the memory cell and one of the adjacent memory cells and corresponding to a conductive strip of the same level as the bit lines (BL0, $\overline{BL0}$), parallel to the bit lines and arranged on the common edge between two adjacent cells.

6. The memory of claim 1, wherein the sources and the drains of first (N1, N2) and third (A1, A2) transistors are aligned parallel to the bit lines (BL0, $\overline{BL0}$).

7. The memory of claim 1, wherein each memory cell comprises two active areas (29, 30), each active area comprising one of the first regions (48, 54) and the associated second region (49, 52), the active areas being substantially symmetrical with respect to the memory cell center.

8. The memory of claim 1, wherein, for each memory cell, arranged between two other adjacent memory cells of the same row, the sources (SN1, SA1, SN2, SA2) and the drains (DN1, DA1, DN2, DA2) of first (N1, N2) and third (A1, A2) transistors are aligned along a common edge between the memory cell and one of the adjacent memory cells.

9. The memory of claim 5, wherein each memory cell is connected to a supply line (VDD) at a second voltage corresponding to a conductive strip of the same level as the bit lines (BL0, $\overline{BL0}$), parallel to the bit lines and arranged between the bit lines.

10. The memory of claim 1, wherein, for each memory cell, arranged between two other adjacent memory cells of the same column, the source (SN1, SN2, SP1, SP2) or the drain (DN1, DN2, DP1, DP2) of first and second transistors (N1, N2, P1, P2) and the source (SA1, SA2) or the drain (DA1, DA2) of a third transistor (A1, A2) are aligned along a common edge between the memory cell and one of the adjacent memory cells.

* * * * *